US012683624B2

(12) United States Patent
Mikuteit et al.

(10) Patent No.: US 12,683,624 B2
(45) Date of Patent: Jul. 14, 2026

(54) DUAL ARBITRATION AND INTERLEAVED SAMPLING ANALOG-TO-DIGITAL CONVERTER (ADC)

(71) Applicant: QUALCOMM Incorporated, San Diego, CA (US)

(72) Inventors: Eric Mikuteit, San Diego, CA (US); Umesh Srikantiah, San Diego, CA (US); Karthik Manivannan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 170 days.

(21) Appl. No.: 18/623,685

(22) Filed: Apr. 1, 2024

(65) Prior Publication Data

US 2025/0309909 A1 Oct. 2, 2025

(51) Int. Cl.
*H03M 1/12* (2006.01)
*G01R 31/3835* (2019.01)

(52) U.S. Cl.
CPC ...... *H03M 1/1245* (2013.01); *G01R 31/3835* (2019.01)

(58) Field of Classification Search
CPC .................................................... H03M 1/1245
USPC .......................................... 341/155, 120, 118
See application file for complete search history.

(56) References Cited

U.S. PATENT DOCUMENTS

| | | | |
|---|---|---|---|
| 8,947,126 | B2 * | 2/2015 | Barrenscheen ...... H03K 17/689 341/142 |
| 2018/0234103 | A1 | 8/2018 | Barrenscheen et al. |
| 2019/0257865 | A1 * | 8/2019 | McPhalen .............. G01R 21/14 |
| 2019/0285699 | A1 * | 9/2019 | Weidner .............. H01M 10/425 |

OTHER PUBLICATIONS

Huang J., et al., "A Dynamic Vision Sensor with Direct Logarithmic Output and Full-frame Picture-on-demand", 2017 IEEE International Symposium on Circuits and Systems (ISCAS), IEEE, May 28, 2017, 4 Pages, XP033156200, figures 1-5 and pp. 1-5.
International Search Report and Written Opinion—PCT/US2025/017651—ISA/EPO—Jun. 4, 2025.
Jing H., "Asynchronous High-speed Feature Extraction Image Sensor", Nanyang Technological University, Jan. 1, 2018, 185 Pages, XP055824531, figures 2.6-2.10, figures 3.1-3.11, pp. 10-120.
Linn A.M.T., et al., "Adaptive Priority Toggle Asynchronous Tree Arbiter for AER-based Image Sensor", 2011 IEEE/IFIP 19th International Conference on VLSI and System-on-Chip, IEEE, Oct. 3, 2011, pp. 66-71, XP032010604, figures 1-9 pp. 66-70.

(Continued)

*Primary Examiner* — Peguy Jean Pierre
(74) *Attorney, Agent, or Firm* — Gerald P. Joyce

(57) ABSTRACT

Certain aspects of the present disclosure are directed towards an apparatus for analog-to-digital conversion. The apparatus generally includes: arbitration circuitry including a first arbiter circuit comprising at least one input coupled to at least one first measurement request interface, and a second arbiter circuit comprising a first input coupled to an output of the first arbiter circuit and at least one second input coupled to at least one second measurement request interface; and an analog-to-digital converter (ADC) coupled to the arbitration circuitry and comprising a control input coupled to an output of the second arbiter circuit.

19 Claims, 5 Drawing Sheets

(56)　　　　　　　References Cited

OTHER PUBLICATIONS

Shoushun C., et al., "A Low Power CMOS Imager based on Time-to-First-Spike Encoding and Fair AER", Conference Proceedings / IEEE International Symposium on Circuits and Systems (ISCAS), May 23-26, 2005, International Conference Center, Kobe, Japan, IEEE Service Center, Piscataway, NJ, May 23, 2005, pp. 5306-5309, XP010817371, figures 1-3.

* cited by examiner

500

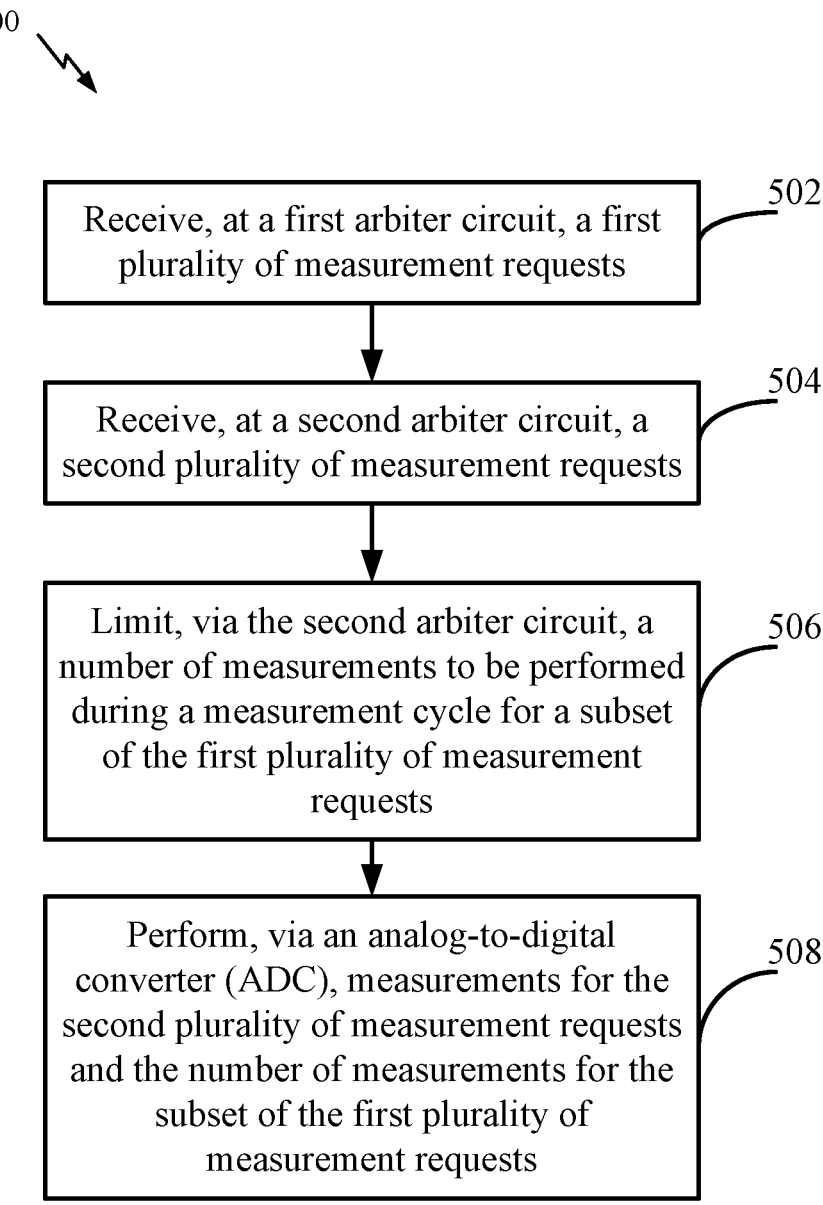

Receive, at a first arbiter circuit, a first plurality of measurement requests — 502

Receive, at a second arbiter circuit, a second plurality of measurement requests — 504

Limit, via the second arbiter circuit, a number of measurements to be performed during a measurement cycle for a subset of the first plurality of measurement requests — 506

Perform, via an analog-to-digital converter (ADC), measurements for the second plurality of measurement requests and the number of measurements for the subset of the first plurality of measurement requests — 508

FIG. 5

DUAL ARBITRATION AND INTERLEAVED SAMPLING ANALOG-TO-DIGITAL CONVERTER (ADC)

TECHNICAL FIELD

Certain aspects of the present disclosure generally relate to electronic circuits and, more particularly, to techniques for analog-to-digital conversion.

BACKGROUND

Power management integrated circuits (power management ICs or PMICs) are used for managing the power scheme of a host system and may include and/or control one or more voltage regulators. A PMIC may be used in battery-operated devices, such as mobile phones, tablets, laptops, wearables, etc., to control the flow and direction of electrical power in the devices. The PMIC may perform a variety of functions for the device, such as DC-to-DC conversion (e.g., using a voltage regulator as described above), battery charging, power-source selection, voltage scaling, power sequencing, etc. The PMIC may include an analog-to-digital converter (ADC) for making various measurements for power management.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure are directed towards an apparatus for analog-to-digital conversion. The apparatus generally includes: arbitration circuitry including a first arbiter circuit comprising at least one input coupled to at least one first measurement request interface, and a second arbiter circuit comprising a first input coupled to an output of the first arbiter circuit and at least one second input coupled to at least one second measurement request interface; and an analog-to-digital converter (ADC) coupled to the arbitration circuitry and comprising a control input coupled to an output of the second arbiter circuit.

Certain aspects of the present disclosure are directed towards a method for analog-to-digital conversion. The method generally includes: receiving, at a first arbiter circuit, a first plurality of measurement requests; receiving, at a second arbiter circuit, a second plurality of measurement requests; limiting, via the second arbiter circuit, a number of measurements to be performed during a measurement cycle for a subset of the first plurality of measurement requests; and performing, via an ADC, measurements for the second plurality of measurement requests and the number of measurements for the subset of the first plurality of measurement requests.

Certain aspects of the present disclosure are directed towards an apparatus for analog-to-digital conversion. The apparatus generally includes: a first arbiter circuit configured to receive a first plurality of measurement requests; a second arbiter circuit configured to receive a second plurality of measurement requests, wherein the second arbiter circuit is further configured to limit a number of measurements to be performed during a measurement cycle for a subset of the first plurality of measurement requests; and an ADC configured to perform measurements for the second plurality of measurement requests and the number of measurements for the subset of the first plurality of measurement requests.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 5 is a flow diagram illustrating example operations for analog-to-digital conversion, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
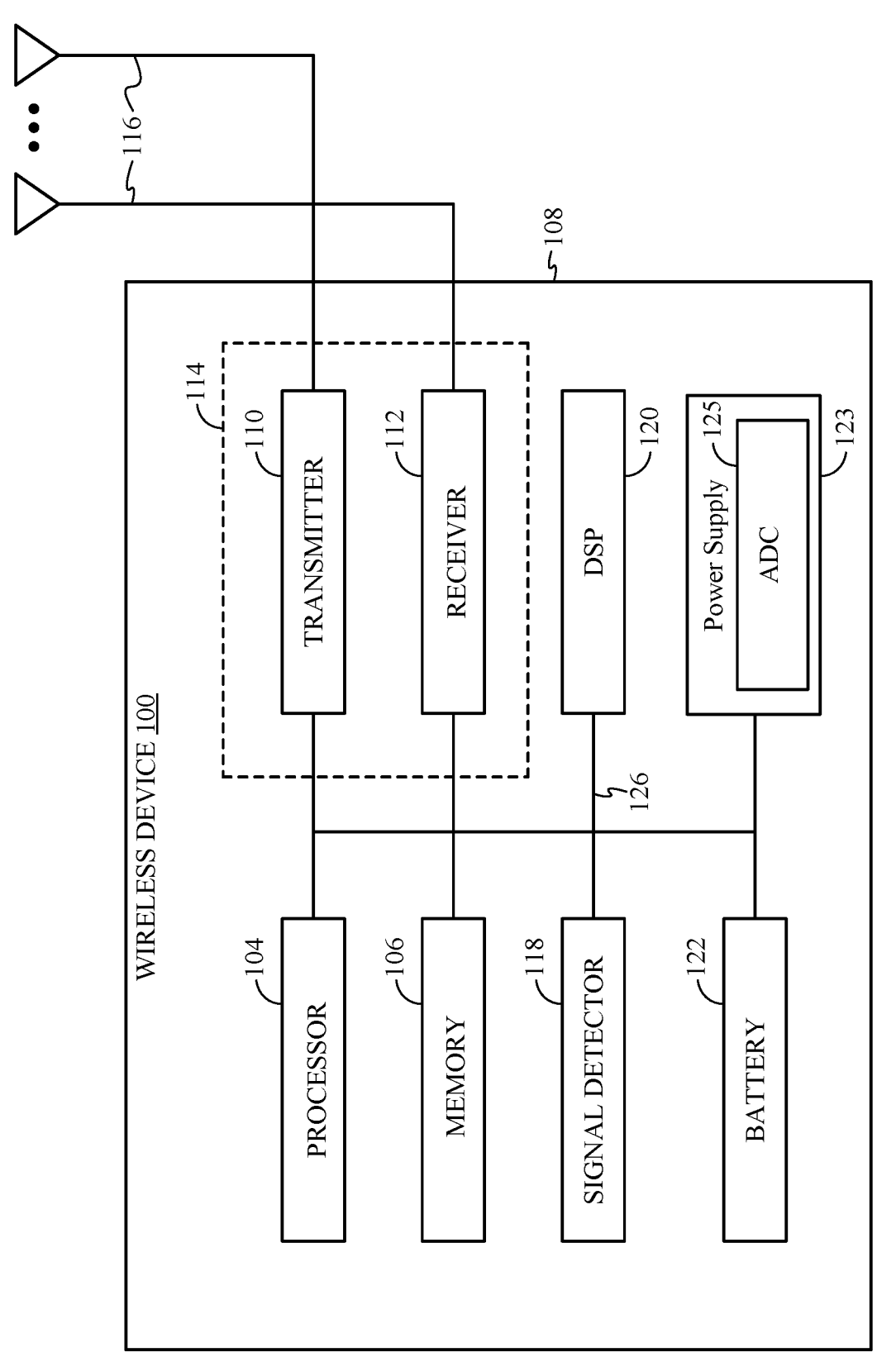
FIG. 1 illustrates a block diagram of an example device that includes a power supply system and analog-to-digital converter (ADC), in which aspects of the present disclosure may be practiced.

Certain aspects of the present disclosure are directed towards dual-arbitration analog-to-digital converter (ADC) hardware. The dual-arbitration scheme may be used for measurement priority, where important (e.g., critical) signals are initiated using an inner loop of arbitration, and only a single client measurement is performed per measurement cycle using an outer loop of arbitration. Certain aspects provide interleaved sample accumulation, where measurements with longer integration windows accumulate samples while the ADC interleaves critical measurements in between. Some aspects also provide hardware designed to allow settling of high source impedance signals on a dedicated multiplexer channel while critical signal measurements are ongoing, as described in more detail herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatuses, such as in the power supply, battery charging circuit, or power management circuit of a communication system, a video codec, audio equipment such as music players and microphones, a television, camera equipment, and test equipment such as an oscilloscope.

FIG. 1 illustrates an example device 100 in which aspects of the present disclosure may be implemented. The device 100 may be a battery-operated device such as a cellular phone, a personal digital assistant (PDA), a handheld device, a wireless device, a laptop computer, a tablet, a smartphone, an Internet of things (IoT) device, a wearable device, a virtual reality (VR) or augmented reality (AR) device, etc.

The device 100 may include a processor 104 that controls operation of the device 100. The processor 104 may also be referred to as a central processing unit (CPU). Memory 106 provides instructions and data to the processor 104. The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122, which may be used to power the various components of the device 100 (e.g., when the device is disconnected from an external power source). The device 100 may also include a power supply system 123 for managing the power from the battery (or from one or more power ports for receiving external power) to the various components of the device 100. At least a portion of the power supply system 123 may be implemented in one or more power management integrated circuits (power management ICs or PMICs) The power supply system 123 may perform a variety of functions for the device 100 such as DC-to-DC conversion, battery charging, power-source selection, voltage scaling, power sequencing, etc. For example, the power supply system 123 may include one or more power supply circuits, which may include a switched-mode power supply circuit. The switched-mode power supply circuit may be implemented by any of various suitable switched-mode power supply circuit topologies, such as a three-level buck converter, a divide-by-two (Div2) charge pump, or an adaptive combination power supply circuit, which can switch between operating in a three-level buck converter mode and a two-level buck converter mode. In some aspects, the power supply system 123 may include an analog-to-digital converter (ADC) 125 for making various measurements for multiple channels or clients, as described in more detail herein.

The various components of the device 100 may be coupled together by a bus system 126, which may include a power bus, a control signal bus, and/or a status signal bus in addition to a data bus. Additionally or alternatively, various combinations of the components of the device 100 may be coupled together by one or more other suitable techniques.

Example Analog-to-Digital Converter (ADC)

A power management integrated circuit (PMIC) analog-to-digital converter (ADC) may have many channels that the ADC has to measure. The PMIC may be implemented with a single ADC for multiple channels to reduce cost and die area. The ADC may have many clients asynchronously making measurement requests. As used herein, a client may be any circuit component across various device domains. For example, a client may be any software or hardware client, such as an application processor, a graphics processor, an application digital signal processor (ADSP), charger hardware, or gauging hardware.

Some measurements may involve long integration windows or many sample averages to reduce noise and improve accuracy. Some measurements are important (e.g., are critical) for system mitigation and should be performed on a known, quick, and repetitive schedule without latency. For example, ADC channels used for important system mitigation tasks (e.g., measurements of the battery voltage, battery current, buck rail current, and the like) should be measured at a high rate (e.g., less than 1 ms per sample). ADC channels used for battery gauging may involve either using a long integration window or taking sample averages to reduce noise.

A few techniques are used to make system ADC measurements for multiple software and hardware clients. In some cases, software arbitration may be used, where all client requests go through a software arbiter to decide which client measurement is to be performed at any point in time. In some cases, client requests enter a first-in-first-out (FIFO) queue and are serviced in the order the requests are received.

In some cases, the ADC automatically cycles around measurement channels in sequence (e.g., a round-robin measurement cycle).

Each of these techniques lacks the capability to meet some speed and low noise specifications. Complex software for arbitration may not run in real-time and may not provide deterministic sample timing that meets system mitigation measurement demands. Some internal hardware ADC measurements may be unable to use a software interface for arbitration. The FIFO method may incur too much delay when multiple clients make requests, which may be problematic for system mitigation measurements. A round-robin measurement cycle may also result in timing specifications for system mitigation measurements not being met.

In order to meet measurement criteria for both high speed and high accuracy, certain aspects of the present disclosure provide a dual-arbitration scheme for measurement priority. With a dual-arbitration scheme for measurement priority, important signal measurements are constantly running on an inner loop of arbitration, and only a single client measurement (or a limited number of client measurements) comes through from an outer loop of arbitration. Interleaved sample accumulation may be used, where measurements involving longer integration windows accumulate samples while the ADC interleaves important measurements. Some aspects allow for hardware settling delay on high source impedance signals on a dedicated multiplexer channel, which can be configured and settled independently of the ADC measurements on important signals.

Figure 2:
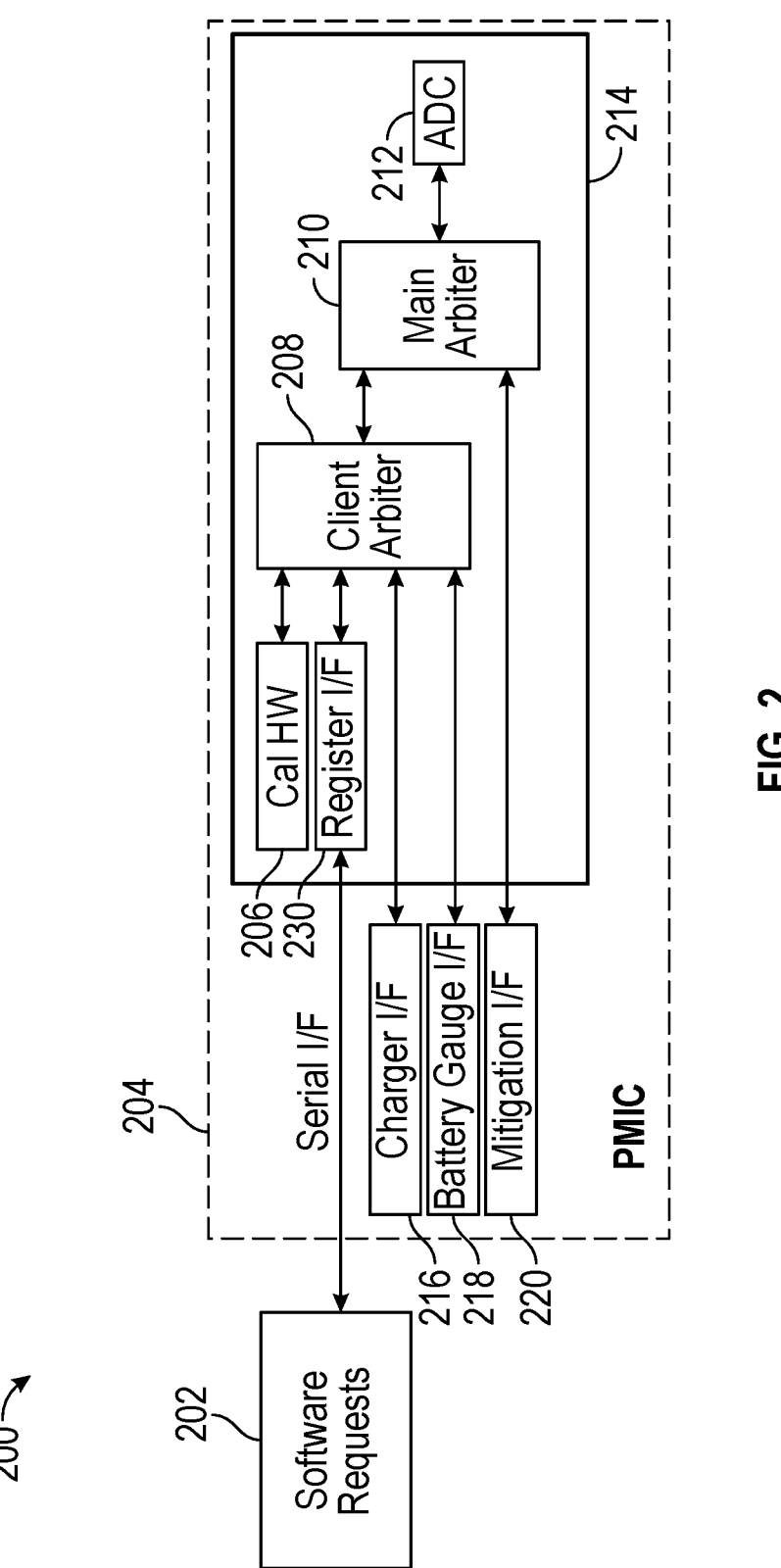
FIG. 2 illustrates example measurement circuitry, in accordance with certain aspects of the present disclosure.

FIG. 2 illustrates example measurement circuitry 200, in accordance with certain aspects of the present disclosure. As shown, the measurement circuitry 200 may include analog-to-digital conversion circuitry 214 that may include an ADC 212 and arbitration circuitry. For example, the circuitry 214 may include a client arbiter circuit 208 and a main arbiter circuit 210. The output of the client arbiter circuit 208 is coupled to an input of the main arbiter circuit 210. An output of the main arbiter circuit 210 may be coupled to a control input of ADC 212 and used to control the ADC (e.g., initiate measurements associated with measurement requests). The main and client arbiters implement two arbitration loops to introduce client (e.g., software, charger, battery gauge, or calibration) measurements, one at a time, interleaved with important mitigation measurements. Important measurements (e.g., also referred to as "critical system measurements" or "critical signal measurements") are sampled in the main arbiter circuit 210, along with a single client measurement sample, which is introduced one at a time, via the client arbiter circuit 208, as described in more detail herein. In this manner, a deterministic update rate is maintained for important signals, independent of other client ADC requests. As used herein, critical signal measurements refer to measurements that may be important for device operations such as battery voltage and current measurements.

As shown, the circuitry 214 may be part of a PMIC 204 (e.g., corresponding to power supply system 123 of FIG. 1). The PMIC may include various interfaces for receiving measurement requests. For example, a serial interface (I/F) may be used to receive software requests 202 (e.g., from a processor such as the processor 104 of FIG. 1). The circuitry 214 may include a register interface 230 for receiving the software requests. A charger interface 216 may request voltage or current measurements for battery charging circuitry. A battery gauge interface 218 may request battery voltage or current measurements. Mitigation interface 220 may provide requests for important measurements for system mitigation. The circuitry 214 may also include calibration (CAL) hardware (HW) 206 that may send requests. The requests from the mitigation interface 220 may be provided directly to the main arbiter circuit 210, whereas other requests may be provided to the client arbiter circuit 208. The arbiter circuits 208, 210 store received requests. The main arbiter circuit 210 controls the interleaving of measurements for requests stored by the main arbiter circuit 210 and the client arbiter circuit 208, as described in more detail with respect to FIG. 3.

Figure 3:
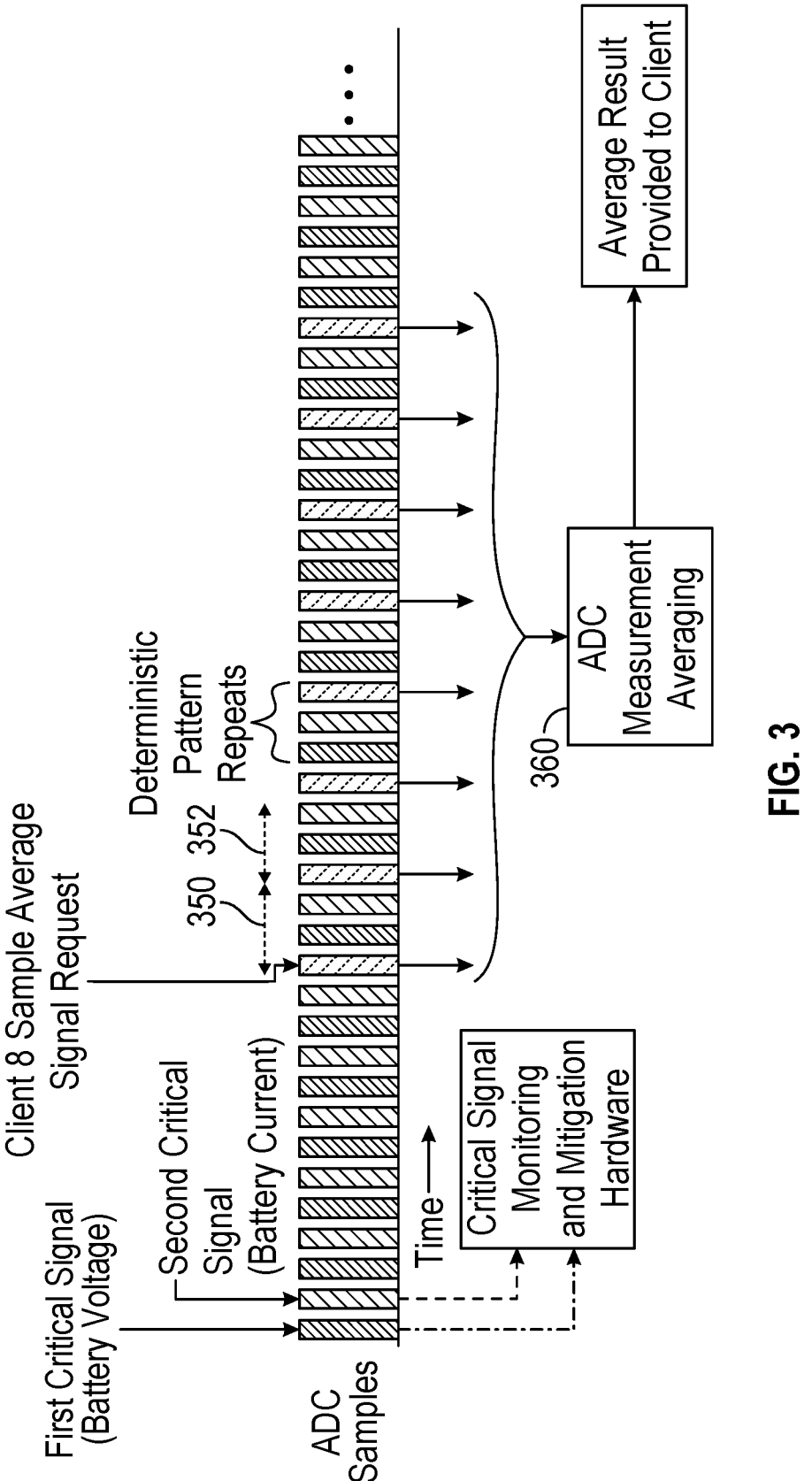
FIG. 3 illustrates interleaving of important and client ADC samples, in accordance with certain aspects of the present disclosure.

FIG. 3 illustrates interleaving of important (e.g., critical) and client ADC samples, in accordance with certain aspects of the present disclosure. As described, the critical signal measurement requests may be received by the main arbiter circuit 210 and the ADC may be controlled to perform the measurements. For instance, the main arbiter circuit 210 may control first and second critical signal measurements for critical signal monitoring and mitigation hardware, such as battery voltage and battery current measurements. The critical signal measurements may be performed in turn until the client arbiter circuit 208 receives a measurement request for a client. For instance, the client arbiter circuit 208 may receive an eight-sample average signal request. The main arbiter circuit 210 may interleave the eight ADC samples with the critical signal measurements, as shown. For example, during a measurement cycle 350, a first client ADC sample may be performed, followed by the battery and current measurements. During a subsequent measurement cycle 352, a second client ADC sample may be performed, followed by the battery and current measurements, and so on. Once all eight ADC samples (measurements) are performed, the ADC measurements are averaged via an averaging component 360, and the averaged result is provided to the client. After the eight samples are performed, only critical signal measurements may continue.

In some aspects, client and critical mitigation measurement samples are interleaved independent of the overall client integration window or sample average count, maintaining a deterministic update rate for critical signal updates. In other words, regardless of the number of averaged samples requested by the client, the measurement pattern for performing a client and critical signal measurements is maintained. The individual ADC samples may be of a fixed duration for all measurements. Only a single client measurement may be introduced to the ADC in the main arbitration loop so the measurement pattern is deterministic. Thus, even if a client requests multiple samples to be averaged, this will not impact the timing of critical measurements. In this manner, fast mitigation signal updates may be provided while also providing low noise client measurements with averaging. Certain aspects provide a configurable hardware settling delay for client measurements while the ADC performs critical measurements at a consistent update rate, as described in more detail with respect to FIG. 4.

Figure 4:
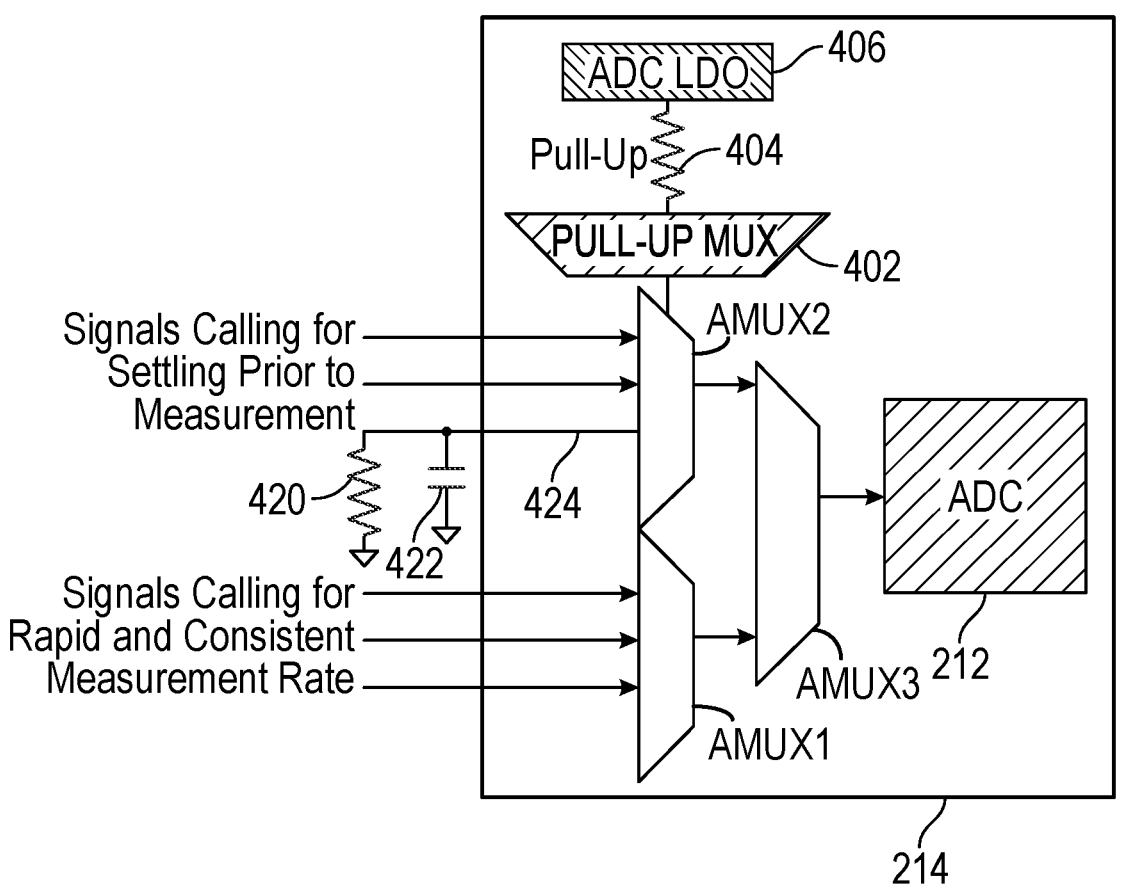
FIG. 4 illustrates multiplexers used for controlling ADC measurements to be performed by the ADC, in accordance with certain aspects of the present disclosure.

FIG. 4 illustrates multiplexers used for controlling ADC measurements to be performed by the ADC 212, in accordance with certain aspects of the present disclosure. The circuitry 214 may include analog multiplexers labeled "AMUX1," "AMUX2," and "AMUX3." AMUX2 may receive signals that should be provided time for settling prior to ADC measurement and AMUX1 may receive critical signals for measurement (e.g., signals that should be measured with rapid and consistent measurement rate). For example, some signals, such as thermistor measurements, should be provided settling time for biasing prior to making a measurement. Moreover, critical measurements should not be delayed while the client signals are allowed to settle.

Thus, using multi-level multiplexing, hardware settling on the configured channel may be performed while critical signal measurements continue. For example, AMUX1 may be used to select a critical signal for measurement and may be operated at a high sample rate. AMUX2 allows signals that should be given time for hardware settling to be configured ahead of time. Inputs of AMUX3 are coupled to outputs of AMUX1 and AMUX2. An output of AMUX3 is coupled to analog signal input of the ADC 212. AMUX3 gates the output of AMUX2 until the signal at the input of AMUX2 has had enough time for settling, allowing critical measurements to continue during the settling time.

AMUX3 may route the output of AMUX1 to the ADC 212 for measurements, while AMUX1 selects the critical signal to be measured. In the meantime, a signal may be provided to the input of AMUX2, AMUX2 may route the signal to an input of AMUX3, and given time to settle. A certain amount of time may be given for the voltage at the input (e.g., at node 424) of AMUX1 to settle to a value due to charging capacitive elements (e.g., parasitic capacitive elements or actual circuit capacitors). After a certain amount of time has elapsed, AMUX3 may route the signal from AMUX2 to the ADC 212 for measurement.

As an example of a measurement that may involve settling time, a resistive element 420 may be measured, where a capacitive element 422 is coupled in parallel with the resistive element 420. The capacitive element 422 may be a capacitor or represent parasitic capacitance. To perform the measurement, a bias voltage may be applied via a voltage source 406 (e.g., low-drop output (LDO) regulator). The bias signal may be applied to node 424 through a pull-up resistive element 404 via the AMUX2 as shown. A certain amount of time may be given for the applied bias voltage to settle (e.g., for the capacitive element 422 to charge). After the amount of time has elapsed, AMUX2 and AMUX3 may be used to provide the voltage at node 424 to the ADC 212 for measurement. With a known resistance of resistive element 404 and known voltage associated with the bias signal that is applied, the resistance of resistive element 420 may be calculated. In some aspects, the pull-up resistive element 404 may be one of multiple pull-up resistive elements coupled between the voltage source 406 and respective inputs of a multiplexer 402 (e.g., labeled "pull-up MUX"). The multiplexer 402 may be used to select one of the multiple pull-up resistive elements to measure resistive element 420.

Certain aspects of the present disclosure are directed towards sharing measurement data (e.g., critical measurement data) across clients requesting the same channel measurement. For example, fast ADC samples for critical measurement updates may be performed, and the measurements may be passed to averaging blocks when clients request averaged data, providing a constant measurement (e.g., critical measurement) update rate and averaged results to clients. In other words, one client may request a battery voltage measurement and another client may request the same battery voltage measurement. Once the battery voltage measurement is performed for one client, the same measurement may be shared with the other client. As another example, a first client may request a battery voltage measurement, and a second client may request a four-sample averaged measurement of the same battery voltage. The battery measurement may be performed for the first client and used as one of the four battery voltage samples to be averaged for the second client.

Certain aspects of the present disclosure provide a technique to simultaneously meet criteria for performing high-speed measurements, providing a deterministic sample update rate, and performing high accuracy measurements, using a dual-arbitration scheme for measurement priority, along with interleaved sample accumulation and hardware settling delay via a dedicated multiplexer channel that is independent of the ADC measurements made on critical signals. A deterministic critical signal measurement timing is provided along with client measurements having low noise and high accuracy, with a low-cost, single ADC design.

FIG. 5 is a flow diagram illustrating example operations 500 for analog-to-digital conversion, in accordance with certain aspects of the present disclosure. The operations 500 may be performed, for example, by analog-to-digital conversion circuitry, such as the analog-to-digital conversion circuitry 214 described with respect to FIG. 2 and FIG. 4.

At block 502, the analog-to-digital conversion circuitry receives, at a first arbiter circuit (e.g., arbiter circuit 208), a first plurality of measurement requests. At block 504, the analog-to-digital conversion circuitry may receive, at a second arbiter circuit (e.g., arbiter circuit 210), a second plurality of measurement requests.

At block 506, the analog-to-digital conversion circuitry may limit, via the second arbiter circuit, a number of measurements to be performed during a measurement cycle for a subset of the first plurality of measurement requests. At block 508, the analog-to-digital conversion circuitry may perform, via an ADC (e.g., ADC 212), measurements for the second plurality of measurement requests and the number of measurements for the subset of the first plurality of measurement requests. The number of measurements may be limited to a single measurement for the first plurality of measurement requests during the measurement cycle.

The first plurality of measurement requests may include a request for a multi-sample ADC measurement to be averaged. The measurement cycle may be one of a plurality of measurement cycles. The analog-to-digital conversion circuitry may average (e.g., averaging component 360) results of the measurements to yield an averaged result after performing measurements for the first plurality of measurement requests during the plurality of measurement cycles (e.g., cycles 350, 352 of FIG. 3), and output the averaged result. Performing the measurements may include performing the second plurality of measurements while at least one first signal for at least one of the first plurality of measurement requests is allowed to settle for a settling period.

EXAMPLE ASPECTS

Aspect 1: An apparatus for analog-to-digital conversion, comprising: arbitration circuitry including: a first arbiter circuit comprising at least one input coupled to at least one first measurement request interface; and a second arbiter circuit comprising a first input coupled to an output of the first arbiter circuit and at least one second input coupled to at least one second measurement request interface; and an analog-to-digital converter (ADC) coupled to the arbitration circuitry and comprising a control input coupled to an output of the second arbiter circuit.

Aspect 2: The apparatus of Aspect 1, wherein the second arbiter circuit is configured to limit a number of measurements to be performed via the ADC during a measurement cycle for requests received by the first arbiter circuit via the at least one first measurement request interface.

Aspect 3: The apparatus of Aspect 2, wherein the number of measurements is limited to a single measurement during the measurement cycle.

Aspect 4: The apparatus according to any of Aspects 1-3, wherein the second arbiter circuit is configured to control the ADC to interleave at least one first measurement requested via the at least one first measurement request interface and at least one second measurement requested via the at least one second measurement request interface.

Aspect 5: The apparatus of Aspect 4, wherein: the at least one first measurement comprises a first plurality of measurements; the at least one second measurement comprises a second plurality of measurements; and to control the ADC to interleave the at least one first measurement and the at least one second measurement, the second arbiter circuit is configured to control the ADC to perform the second plurality of measurements during each of multiple measurement cycles and a single one of the first plurality of measurements during each of the multiple measurement cycles.

Aspect 6: The apparatus of Aspect 5, wherein the second plurality of measurements comprises critical system measurements.

Aspect 7: The apparatus of Aspect 5 or 6, further comprising an averaging component configured to average the first plurality of measurements.

Aspect 8: The apparatus according to any of Aspects 1-7, further comprising: a first multiplexer comprising inputs configured to receive at least one first signal; a second multiplexer comprising inputs configured to receive at least one second signal; and a third multiplexer comprising inputs coupled to outputs of the first multiplexer and the second multiplexer and an output coupled to an analog signal input of the ADC.

Aspect 9: The apparatus of Aspect 8, wherein the arbitration circuitry is configured to control the first multiplexer, the second multiplexer, and the third multiplexer.

Aspect 10: The apparatus of Aspect 8 or 9, wherein the at least one first signal is requested via the at least one first measurement request interface, and wherein the at least one second signal is requested via the at least one second measurement request interface.

Aspect 11: The apparatus according to any of Aspects 8-10, wherein the second multiplexer and the third multiplexer are configured to provide the at least one second signal to the ADC for measurement while the at least one first signal is allowed to settle for a settling period.

Aspect 12: The apparatus of Aspect 11, wherein, during the settling period, at least one capacitive element is charged via the at least one first signal.

Aspect 13: The apparatus of Aspect 11 or 12, further comprising a voltage source configured to provide a bias signal to a node coupled to one of the inputs of the first multiplexer during the settling period.

Aspect 14: The apparatus according to any of Aspects 1-13, wherein: the ADC is configured to perform a measurement in response to a first request received via the at least one first measurement request interface or the at least one second measurement request interface; and the measurement performed for the first request is shared with a circuit component in response to a second request received from the circuit component via the at least one first measurement request interface or the at least one second measurement request interface.

Aspect 15: A method for analog-to-digital conversion, comprising: receiving, at a first arbiter circuit, a first plurality of measurement requests; receiving, at a second arbiter circuit, a second plurality of measurement requests; limiting, via the second arbiter circuit, a number of measurements to be performed during a measurement cycle for a subset of the first plurality of measurement requests; and performing, via an analog-to-digital converter (ADC), measurements for the second plurality of measurement requests and the number of measurements for the subset of the first plurality of measurement requests.

Aspect 16: The method of Aspect 15, wherein the number of measurements is limited to a single measurement for the first plurality of measurement requests during the measurement cycle.

Aspect 17: The method of Aspect 15 or 16, wherein the first plurality of measurement requests comprises a request for a multi-sample ADC measurement to be averaged.

Aspect 18: The method according to any of Aspects 15-17, wherein: the measurement cycle is one of a plurality of measurement cycles; and the method further comprises: averaging results of the measurements to yield an averaged result after performing measurements for the first plurality of measurement requests during the plurality of measurement cycles; and outputting the averaged result.

Aspect 19: The method according to any of Aspects 15-18, wherein performing the measurements includes performing measurements for the second plurality of measurement requests while at least one signal for at least one of the first plurality of measurement requests is allowed to settle for a settling period.

Aspect 20: An apparatus for analog-to-digital conversion, comprising: a first arbiter circuit configured to receive a first plurality of measurement requests; a second arbiter circuit configured to receive a second plurality of measurement requests, wherein the second arbiter circuit is further configured to limit a number of measurements to be performed during a measurement cycle for a subset of the first plurality of measurement requests; and an analog-to-digital converter (ADC) configured to perform measurements for the second plurality of measurement requests and the number of measurements for the subset of the first plurality of measurement requests.

ADDITIONAL CONSIDERATIONS

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An apparatus for analog-to-digital conversion, comprising:
   arbitration circuitry including:
      a first arbiter circuit comprising at least one input coupled to at least one first measurement request interface; and
      a second arbiter circuit comprising a first input coupled to an output of the first arbiter circuit and at least one second input coupled to at least one second measurement request interface; and
   an analog-to-digital converter (ADC) coupled to the arbitration circuitry and comprising a control input coupled to an output of the second arbiter circuit, wherein the second arbiter circuit is configured to limit a number of measurements to be performed via the ADC during a measurement cycle for requests received by the first arbiter circuit via the least one first measurement request interface.

2. The apparatus of claim 1, wherein the number of measurements is limited to a single measurement during the measurement cycle.

3. The apparatus of claim 1, wherein the second arbiter circuit is configured to control the ADC to interleave at least one first measurement requested via the at least one first measurement request interface and at least one second measurement requested via the at least one second measurement request interface.

4. The apparatus of claim 3, wherein:
   the at least one first measurement comprises a first plurality of measurements;
   the at least one second measurement comprises a second plurality of measurements; and
   to control the ADC to interleave the at least one first measurement and the at least one second measurement, the second arbiter circuit is configured to control the ADC to perform the second plurality of measurements during each of multiple measurement cycles and a single one of the first plurality of measurements during each of the multiple measurement cycles.

5. The apparatus of claim 4, wherein the second plurality of measurements comprises critical system measurements.

6. The apparatus of claim 4, further comprising an averaging component configured to average the first plurality of measurements.

7. The apparatus of claim 1, further comprising:
   a first multiplexer comprising inputs configured to receive at least one first signal;
   a second multiplexer comprising inputs configured to receive at least one second signal; and
   a third multiplexer comprising inputs coupled to outputs of the first multiplexer and the second multiplexer and an output coupled to an analog signal input of the ADC.

8. The apparatus of claim 7, wherein the arbitration circuitry is configured to control the first multiplexer, the second multiplexer, and the third multiplexer.

9. The apparatus of claim 7, wherein the at least one first signal is requested via the at least one first measurement request interface, and wherein the at least one second signal is requested via the at least one second measurement request interface.

10. The apparatus of claim 7, wherein the second multiplexer and the third multiplexer are configured to provide the at least one second signal to the ADC for measurement while the at least one first signal is allowed to settle for a settling period.

11. The apparatus of claim 10, wherein, during the settling period, at least one capacitive element is charged via the at least one first signal.

12. The apparatus of claim 10, further comprising a voltage source configured to provide a bias signal to a node coupled to one of the inputs of the first multiplexer during the settling period.

13. The apparatus of claim 1, wherein:
   the ADC is configured to perform a measurement in response to a first request received via the at least one first measurement request interface or the at least one second measurement request interface; and
   the measurement performed for the first request is shared with a circuit component in response to a second request received from the circuit component via the at least one first measurement request interface or the at least one second measurement request interface.

14. A method for analog-to-digital conversion, comprising:
   receiving, at a first arbiter circuit, a first plurality of measurement requests;
   receiving, at a second arbiter circuit, a second plurality of measurement requests;
   limiting, via the second arbiter circuit, a number of measurements to be performed during a measurement cycle for a subset of the first plurality of measurement requests; and
   performing, via an analog-to-digital converter (ADC), measurements for the second plurality of measurement requests and the number of measurements for the subset of the first plurality of measurement requests.

15. The method of claim 14, wherein the number of measurements is limited to a single measurement for the first plurality of measurement requests during the measurement cycle.

16. The method of claim 14, wherein the first plurality of measurement requests comprises a request for a multi-sample ADC measurement to be averaged.

17. The method of claim 14, wherein:
   the measurement cycle is one of a plurality of measurement cycles; and
   the method further comprises:
      averaging results of the measurements to yield an averaged result after performing measurements for the first plurality of measurement requests during the plurality of measurement cycles; and
      outputting the averaged result.

18. The method of claim 14, wherein performing the measurements includes performing measurements for the second plurality of measurement requests while at least one signal for at least one of the first plurality of measurement requests is allowed to settle for a settling period.

19. An apparatus for analog-to-digital conversion, comprising:
   a first arbiter circuit configured to receive a first plurality of measurement requests;

a second arbiter circuit configured to receive a second plurality of measurement requests, wherein the second arbiter circuit is further configured to limit a number of measurements to be performed during a measurement cycle for a subset of the first plurality of measurement requests; and an analog-to-digital converter (ADC) configured to perform measurements for the second plurality of measurement requests and the number of measurements for the subset of the first plurality of measurement requests.

\* \* \* \* \*